US005331165A

United States Patent [19]

Frame

[11] Patent Number: 5,331,165

[45] Date of Patent: Jul. 19, 1994

[54] SPLIT EVENT REDUCED X-RAY IMAGER

[75] Inventor: Wayne W. Frame, Longmont, Colo.

[73] Assignee: Ball Corporation, Muncie, Ind.

[21] Appl. No.: 983,943

[22] Filed: Dec. 1, 1992

[51] Int. Cl.[5] .......... H01L 27/14; H01L 29/78

[52] U.S. Cl. .......... 250/370.09; 250/208.1; 257/230; 257/444; 257/445; 348/250

[58] Field of Search .......... 250/370.09, 208.1; 257/225, 226, 227, 228, 229, 230, 231, 232, 233, 237, 429, 444, 445, 446; 358/213.19, 213.15, 111

[56] References Cited

U.S. PATENT DOCUMENTS

| | | | |
|---|---|---|---|
| 3,896,474 | 7/1975 | Amelio et al. | 257/230 |
| 4,027,381 | 6/1977 | Tasch, Jr. et al. . | |
| 4,027,382 | 6/1977 | Tasch, Jr. et al. . | |
| 4,035,906 | 7/1977 | Tasch et al. . | |
| 4,061,530 | 12/1977 | Hosack . | |
| 4,063,992 | 12/1977 | Hosack . | |
| 4,074,302 | 2/1978 | Brewer . | |
| 4,167,017 | 9/1979 | Tasch, Jr. et al. . | |
| 4,225,947 | 9/1980 | Councill et al. . | |
| 4,232,245 | 11/1980 | Savoye et al. | 257/445 |
| 4,246,591 | 1/1981 | Kosonocky et al. . | |
| 4,302,766 | 11/1981 | Guterman et al. . | |
| 4,372,031 | 2/1983 | Tsaur et al. . | |
| 4,556,851 | 12/1985 | Levine . | |
| 4,580,155 | 4/1986 | Tsoi et al. . | |
| 4,679,212 | 7/1987 | Hynecek . | |
| 4,796,072 | 1/1989 | Higashi et al. | 257/446 |
| 4,811,078 | 3/1989 | Tigelaar et al. . | |
| 4,819,067 | 4/1989 | Berger et al. . | |
| 4,837,607 | 6/1989 | Kemmer et al. . | |
| 4,862,487 | 8/1989 | Ando et al. . | |
| 4,903,284 | 2/1990 | Esser . | |
| 4,926,225 | 5/1990 | Hosack . | |
| 4,950,620 | 8/1990 | Harrington, III . | |
| 4,951,122 | 8/1990 | Tsubosaki et al. . | |
| 4,963,952 | 10/1990 | Janesick | 257/229 |
| 5,008,758 | 4/1991 | Burke . | |
| 5,055,900 | 10/1991 | Fossum et al. | 257/236 |
| 5,077,592 | 12/1991 | Janesick . | |
| 5,187,369 | 2/1993 | Kingsley et al. | 250/370.09 |

*Primary Examiner*—Paul M. Dziezynski
*Assistant Examiner*—Drew A. Dunn
*Attorney, Agent, or Firm*—Gilbert E. Alberding

[57] ABSTRACT

The present invention relates to a charge coupled device CCD X-ray imager for reducing split events during integration. The imager includes a semiconductor material having a photosensitive region for receiving X-ray radiation energy and for generating electrical charges corresponding to the received X-ray radiation, and having a plurality of permanent barriers formed therein to divide the semiconductor material into a plurality of columns. Barrier electrodes are coupled to the semiconductor material for establishing in said semiconductor material a plurality of temporary barriers having a sufficient potential gradient to substantially reduce the occurrence of split events. Collection site electrodes are coupled to the semiconductor material for effecting the collection of the generated electrical charges. The temporary barriers are erected in the columns to form an array of potential wells.

19 Claims, 4 Drawing Sheets

SPLIT EVENT REDUCED X-RAY IMAGER

FIELD OF INVENTION

This invention relates to charge coupled device (CCD) imagers, and, more particularly, to an improved CCD X-ray imager for reducing split events during integration of soft X-ray radiation to provide improved image resolution.

BACKGROUND OF THE INVENTION

An imager consists of an array of sensors responsive to radiant energy incident on the array. During operation of the imager, the radiant energy is incident on the sensor array for a predetermined exposure time, called the integration period, and converted to corresponding electrical charge packets which are stored in potential wells. Typically, charge packets are periodically shifted into a parallel shift register and then shifted to an output structure for external sensing.

Charge coupled device (CCD) imagers may be of the metal-oxide-silicon (MOS) type which store a charge in potential wells created either at the surface, or in a semiconductor substrate, and separated from each other by channel stops and/or by suitably applied potentials in each of two opposite directions. The charge is transported along the surface or in the substrate by the application of bias potentials to alter the configuration of potential wells.

In an X-ray imager, soft X-ray radiation energy incident on the silicon substrate is absorbed within the substrate and converted to localized electrical charge packets. The amount of charge generated is proportional to the energy absorbed. The location within the silicon substrate where this energy-to-charge conversion occurs is dependent upon the penetration depth of the energy. When the penetration depth of the radiant energy is greater than the depletion layer of the silicon substrate, for a given applied potential, charges are generated in a neutral region of the substrate outside the confines of the potential wells. Split events occur when the generated charges spread randomly due to repulsion and diffusion effects before the charges reach the potential wells. As a result, the randomly spreading charges are divided among adjacent potential wells which in turn degrades the image resolution.

One approach to reduce the diffusion effects on resolution degradation, as disclosed in U.S. Pat. No. 4,580,155, is to increase the depletion layer width in silicon for a suitable applied potential so that most of the radiant energy is absorbed within the depletion layer itself instead of in the neutral region. The electric field in the depletion layer sweeps the carriers towards the surface. This reduces the carrier transportation time and thus the amount of charge spreading due to diffusion effects. Since the depletion layer width in silicon increases with its resistivity, one way to improve the resolution is to make charge coupled imagers on high resistivity substrates.

For the near IR (wavelength from 0.8 to 1.0 microns) and soft X-ray (1 to 10 KeV) regions, substrate resistivities as high as 5 KΩ-cm are required to produce the required depletion layer width. There are a number of reported problems in fabricating charge-coupled imagers on such a high resistivity substrate. First, a resistivity drop has been reported due both to thermal degradation for processing temperatures greater than 950° C. and to impurity contamination. Secondly, even if resistivity were preserved, transistors fabricated on such high resistivities cannot function due to the extremely low punch-through voltage between source and drain. However, due to performance requirements, charge detection is only practical with on-chip transistor circuitry. The invention of U.S. Pat. No. 4,580,155 provides adjacent regions of high resistivity and low resistivity on the same chip, wherein a charge coupled array is fabricated in the high resistivity region and an output circuit is fabricated in the low resistivity region.

Another effort in the CCD imager art, such as for example, U.S. Pat. No. 4,963,952, has been directed toward the elimination of dark current by using a multipinned phase charge coupled device. In the invention of U.S. Pat. No. 4,963,952, the siliconsilicon dioxide interfaces of a back-illuminated CCD are passivated by biasing the Si—$SiO_2$ interfaces in the front and back. On the front multiphase-gate side, biasing and pinning the phase-clocked array gates into inversion (hence the term "multipinned-phase") causes holes to populate at the interface, thus eliminating surface dark current generation. However, to avoid adverse effects in full well capacity, implanting p dopants in the areas confined beneath one or more of the phase-clocked gates is necessary, thus providing a potential difference between the phased gates to allow charge to gather in collecting sites free of extra dopant while maintaining the inverted condition, and thereafter transferring the charges from well to well during readout. On the backside of the CCD, the Si—$SO_2$ interface is passivated by negative biasing a metal flash gate to heavily populate the interface with holes. This eliminates backside dark current and directs photogenerated carriers away from the back to the front where they are collected in wells and then transferred out under control of multiphased clocks. An additional advantage of negative biasing on the metal flash gate is that the bias may be used as a shutter to control the rate of exposure.

Still another effort in the CCD imager art, as disclosed in U.S. Pat. No. 4,286,591, is a CCD imager of the field transfer type having a surface channel A register for storage and transfer of charges, having a B register of either a buried channel or surface channel type for temporary storage of field charges shifted from the A register, and having a buried channel CCD C register coupled to the B register for receiving charge signals, in parallel, a row at a time, from the B register.

Still other efforts in the CCD art have been directed toward, for example: reducing CCD chip power dissipation, as in U.S. Pat. No. 4,903,284; improving charge transfer, as in U.S. Pat. No. 4,819,067; and using a CCD as a memory device, as in U.S. Pat. No. 4,225,947.

SUMMARY OF THE INVENTION

The present invention relates to a charge coupled device X-ray imager and method for reducing split events during integration. The imager includes: a semiconductor material having a photosensitive surface for receiving X-ray radiation energy, having an internal region for generating electrical charges corresponding to the received X-ray radiation, and having a plurality of permanent barriers formed therein to divide the substrate into a plurality of columns; barrier means coupled to the semiconductor material for establishing in the semiconductor material a plurality of temporary barriers having sufficient potential gradient to substantially reduce the occurrence of split events; and collection means coupled to the semiconductor material for effecting collection and readout of the generated electrical charges. The temporary barriers in conjunction with the permanent barriers form an array of potential wells.

Preferably, the barrier means includes a plurality of barrier electrodes, each barrier electrode being positioned adjacent to a portion of the semiconductor material wherein the temporary barrier is to be established. The barrier means further includes a three-phase clock coupled to each of the plurality of barrier electrodes for applying a voltage to each of the plurality of barrier electrodes to establish the temporary barriers.

Preferably, the collection means includes a plurality of collection site electrodes coupled to the three-phase clock for energizing the collection site electrodes during an integration period to effect a collection of electrical charges in the array of potential wells.

In all preferred embodiments, the width and/or surface area of each of the plurality of barrier electrodes is substantially smaller than the width and/or surface area of each of the plurality of collection site electrodes.

In one preferred embodiment, the semiconductor material comprises silicon p-type material. The permanent barriers are formed by implanting an n-type dopant in the silicon p-type material. Preferably, the n-type dopant comprises phosphorous.

In another preferred embodiment, the imager is a multipinned phased CCD in which the semiconductor material comprises silicon n-type material. The permanent barriers are formed by implanting an p-type dopant in the silicon n-type material. Preferably, the p-type dopant comprises boron.

An improved method for collecting electrical charges generated by photons of X-ray radiation received by an X-ray imager while reducing the occurrence of split events, includes the steps of: providing a semiconductor substrate having a photosensitive surface receiving X-ray photons; providing an electrode surface on the semiconductor substrate for receiving a plurality of barrier electrodes and a plurality of collection site electrodes; sizing a width of each of the plurality of barrier electrodes substantially smaller than a surface area of each of the collection site electrodes; providing a region in the semiconductor substrate for generating electric charges corresponding to the X-ray photons; establishing a plurality of permanent barriers in the semiconductor substrate to divide a portion of the semiconductor substrate into a plurality of columns; energizing the plurality of barrier electrodes to erect a corresponding plurality of temporary barriers having sufficient potential gradient to reduce the occurrence of split events, the temporary barriers being positioned in the columns to create an array of potential wells; and energizing the collection site electrodes during an integration period to effect a collection of electrical charges within the potential wells.

Other features and advantages of the invention may be determined from the drawings and detailed description of the invention that follows.

DETAILED DESCRIPTION OF THE PREFERRED EMBODIMENTS

Figure 1:
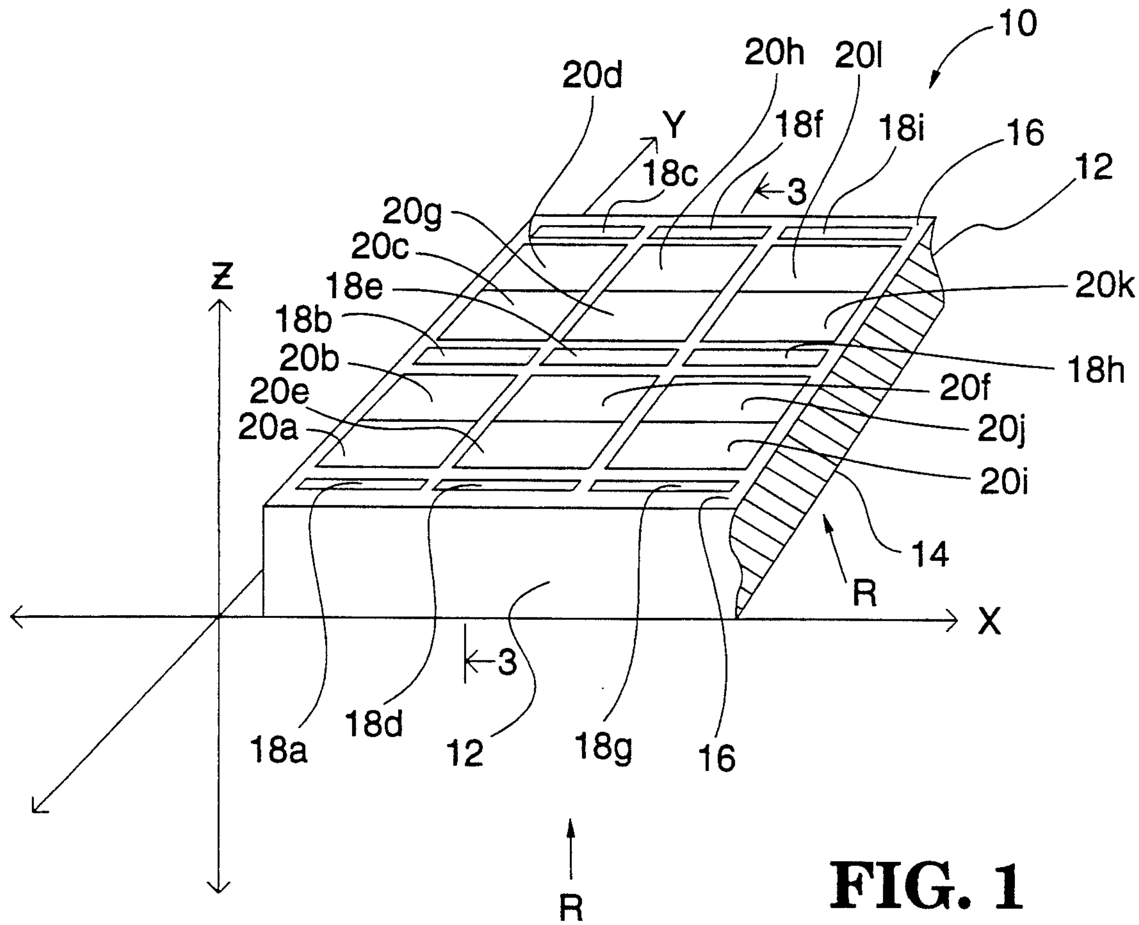
FIG. 1 shows a portion of an improved CCD X-ray imager embodying the present invention.

FIG. 1 shows a corner portion of an improved charge coupled device (CCD) X-ray imager 10 lying on an X-Y plane for purposes of illustration. CCD X-ray imager 10 provides for a reduction in the occurrence of split events during an integration, or X-ray exposure, period. Imager 10 includes a semiconductor substrate 12 having a photosensitive surface 14 (facing downwardly in FIG. 1) on one side and having an electrode surface 16 on the opposite side. Positioned on electrode surface 16 is a plurality of narrow barrier creating electrodes **18*a*, 18*b*, 18*c*, 18*d*, 18*e*, 18*f*, 18*g*, 18*h* and 18*i*, which are energized by one phase of a 3-phase clock (not shown) to erect a temporary potential barrier within the semiconductor substrate 12 under each of the barrier creating electrodes 18*a*–18*i*. Permanent barriers are created parallel to the X axis by implanting an impurity in the substrate during the fabrication of the imager substrate 12. The temporary barriers and the permanent barriers formed in semiconductor substrate 12 intersect in a grid fashion to create wells or pixels for collecting electric charges generated when photons of X-ray radiation energy (R) are incident on photosensitive surface 14. Also positioned on electrode surface 16 is a plurality of collection site electrodes 20*a*, 20*b*, 20*c*, 20*d*, 20*e*, 20*f*, 20*g*, 20*h*, 20*i*, 20*j*, 20*k*, and 201** which are energized by the second and third phases of the 3-phase clock (not shown) to provide full well capacity and to aid in the collection and transportation of electrical charges.

Figure 2:
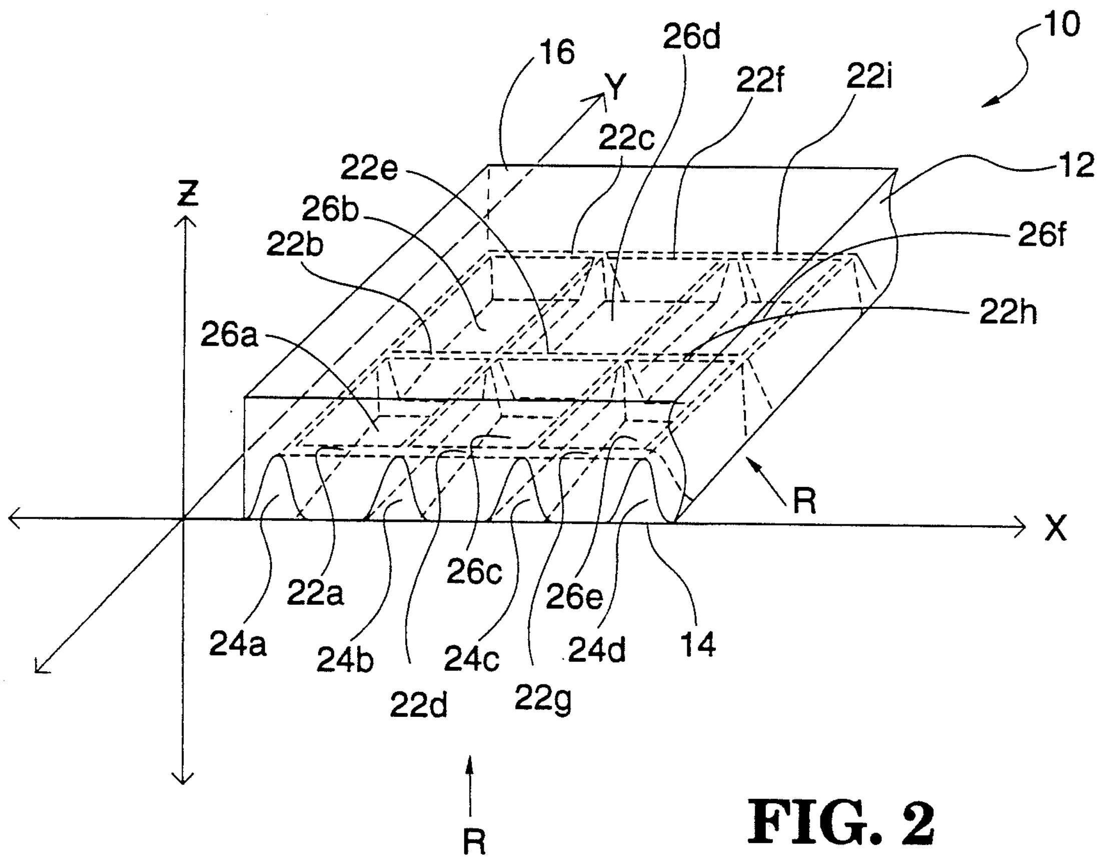
FIG. 2 shows a pictorial diagram illustrating the barrier regions and potential well regions in the semiconductor substrate of the X-ray imager of the present invention.

FIG. 2 shows a diagrammatic representation of the corner portion of imager 10 of FIG. 1 with the electrodes removed to more clearly illustrate the location of the barriers formed in semiconductor substrate 12 prior to integration. Semiconductor substrate 12 has a plurality of temporary barriers **22*a*, 22*b*, 22*c*, 22*d*, 22*e*, 22*f*, 22*g*, 22*h* and 22*i* which are created below barrier creating electrodes 18*a*–18*i* shown in FIG. 1. A plurality of permanent barriers 24*a*, 24*b*, 24*c* and 24*d* are implanted in semiconductor substrate 12 during fabrication of semiconductor substrate 12. Temporary barriers 22*a*–22*i* intersect permanent barriers 24*a*–24*d* to form wells, or pixels 26*a*, 26*b*, 26*c*, 26*d*, 26*e* and 26*f* for collecting electric charges (e) which are generated when photons of X-ray radiation are incident on photo-sensitive surface 14. Although the array of pixels 26*a–f* is shown as a two-by-three array for purposes of illustration, it should be understood that imager 10 could include hundreds of rows and hundreds of columns of wells 26, and the number of wells 26 formed in semiconductor substrate 12** is primarily limited by the size of the semiconductor die and the fabrication process used.

As shown in FIG. 2, temporary barriers **22*a*–22*i* and permanent barriers 24*a*–24*d* have a bell-shaped cross-section which may be viewed as defined by tapered walls which diminish in their distance apart in the direction from photo-sensitive surface 14 toward electrode surface 16. The tapered barriers 22*a*–22*i* and 24*a*–24*d*** significantly reduce the occurrence of split events during integration. Split events occur when the electric charges (e) resulting from absorbed soft X-ray radiation at one location spread randomly and are divided between several wells *26a–f* during integration. Each photo electric charge (e) is a localized phenomena, initially, but in time the electric charges (e) will experience repulsion and diffusion, and spread randomly. If the barrier region is wide adjacent the electrode surface 16, then a substantial horizontal portion of the barrier is essentially gradient free, thus, creating a region of ambiguity in which it cannot be predicted into which pixel the charge will be collected. By minimizing the width of the barrier, the area of ambiguity will be reduced. This invention minimizes the width of temporary barriers 22*a*–22*i* by making the barrier creating electrodes 18*a*–18*i* as narrow as physically possible. Thus, the barrier creating electrodes are constructed substantially narrower than the charge collection site electrodes to reduce the charges from being randomly divided among adjacent pixels during integration.

Figure 3:
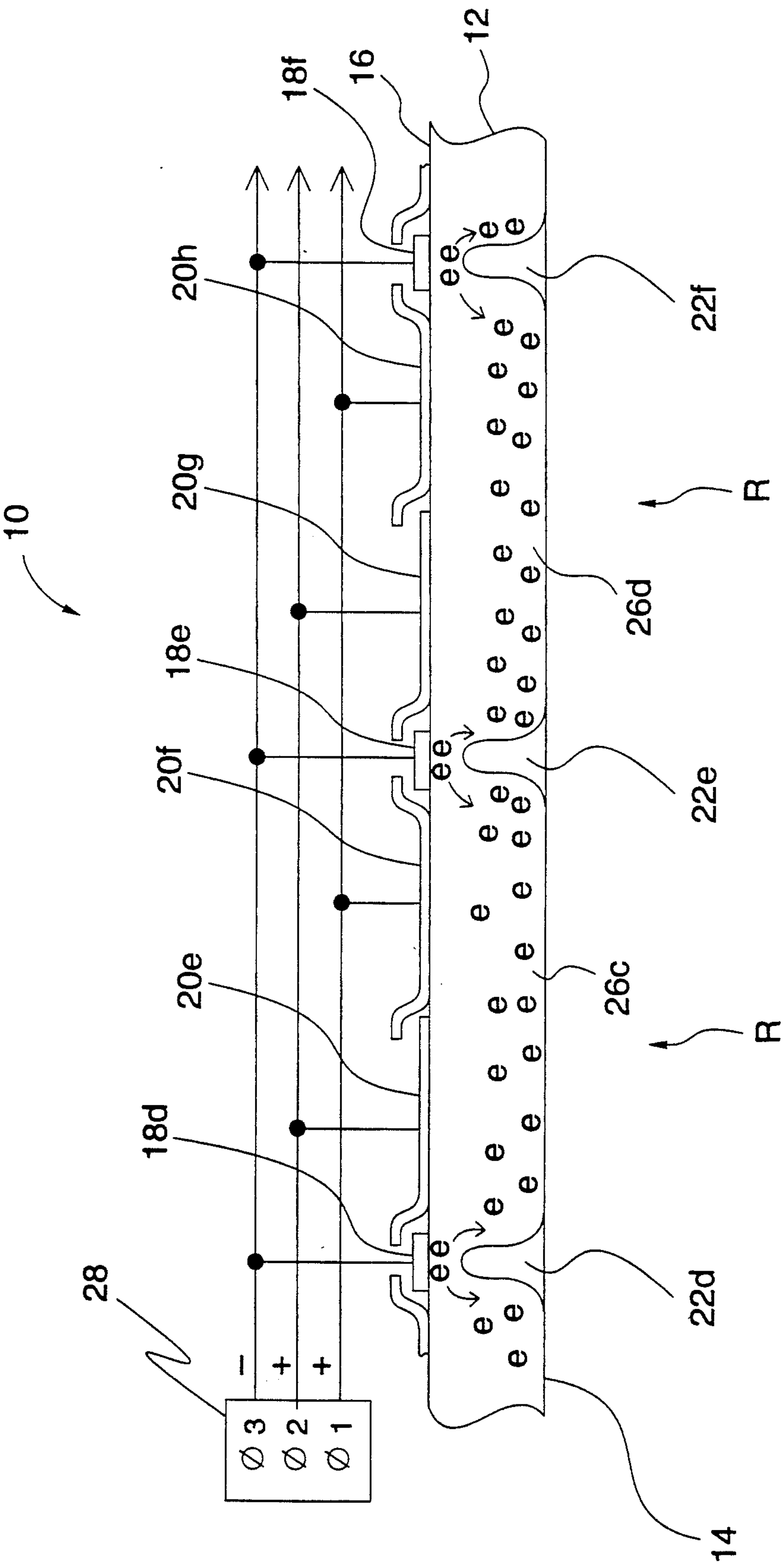
FIG. 3 shows a sectional view of the X-ray imager taken along section line 3-3 of FIG. 1 and shows pictorially a sectioned view of the temporary barriers.

FIG. 3 shows a sectional view of imager 10 taken along a plane passing through section line 3—3 shown in FIG. 1. Imager 10 is shown coupled to a 3-phase clock 28. Phase three of 3-phase clock 28 is coupled to barrier creating electrodes 18*d*, 18*e* and 18*f*. Phase two of 3-phase clock 28 is coupled to collection site electrodes 20*e* and 20*g*. Phase one of 3-phase clock 28 is coupled to collection site electrodes 20*f* and 20*h*. Just prior to integration, the polarity of phase three of phase clock 28 becomes negative, and the polarity of phases two and/or one become positive. The negative polarity of phase three causes barrier electrodes 18*d*, 18*e* and 18*f* to become negatively charged, resulting in the establishment of temporary barriers 22*d*, 22*e* and 22*f*, each having a significant potential gradient in the barrier region closest to electrode surface 16. The potential gradient of temporary barriers 22*d*, 22*e* and 22*f* is created by making the width of corresponding barrier electrodes 18*d*, 18*e* and 18*f* significantly narrower than the width of the collection site electrodes 20*e*–20*h* positioned therebetween. As shown in FIG. 3, the region between temporary barriers 22*d* and 22*e* is a cross section of well 26*c*. The region between temporary barriers 22*e* and 22*f* is a cross section of well 26*d*.

During integration, photons of X-ray radiation (R) are incident on photo-sensitive surface 14 of semiconductor substrate 12 and generate electric charges (e) in relation to the intensity of the X-ray radiation (R). Due to the potential gradient of temporary barriers 22*d*, 22*e* and 22*f*, electric charges (e) created near the barrier-creating electrodes 18*d*, 18*e* and 18*f* (e.g. near the apex of the tapered region of the barriers) are directed toward the closest adjacent well, thus significantly reducing or eliminating the occurrence of split events during integration.

In one preferred embodiment, the semiconductor substrate 12 is a p-type silicon material. The permanent barriers are created by implanting an n-type material, such as phosphorus into substrate 12. The phosphorus is implanted at 200 KeV. The temporary barriers are created by applying a negative voltage, such as negative 8 volts to the barrier creating electrodes, while simultaneously applying a positive voltage, such as 10 volts to the collection site electrodes to establish each potential well. These voltages are maintained during the integration process. At the end of the integration process, the collected electric charges (e) may be transferred in parallel along the columns of wells by charge transfer methods well known in the art.

Figure 4:
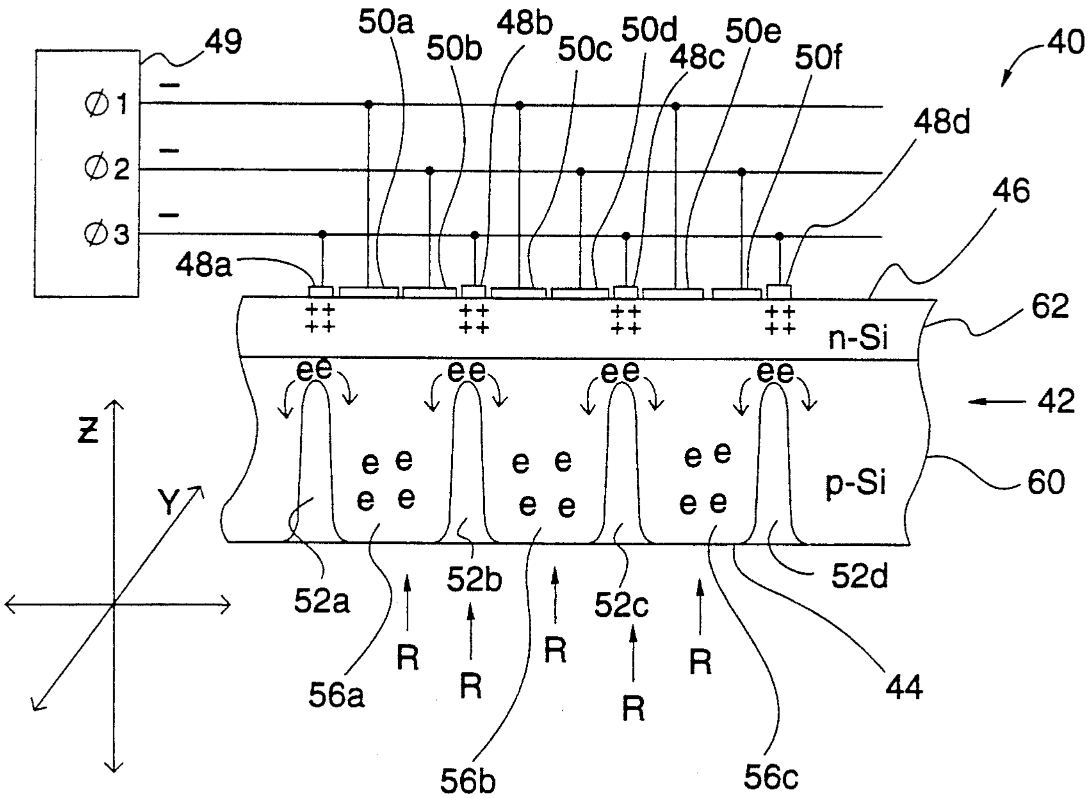
FIG. 4 shows a sectional view of a multi-phased pinned (MPP) embodiment of the CCD X-ray imager of the present invention.

FIG. 4 shows another embodiment of the imager of the present invention. Imager 40 is manufactured as a multi-pinned phased (MPP) imager and includes a semiconductor substrate 42 having a photosensitive surface 44 on one side and having an electrode surface 46 on the opposite side. Positioned on electrode surface 46 is a plurality of narrow barrier creating electrodes 48*a*, 48*b*, 48*c*, and 48*d*, which are energized by phase three of a 3-phase clock 49 to erect a corresponding plurality of temporary potential barriers 52*a*, 52*b*, 52*c* and 52*d* within the semiconductor substrate 42 under each of the barrier creating electrodes 48*a*–48*d*. Permanent barriers are created parallel to the X axis by implanting an impurity in the substrate during the fabrication of the imager substrate 42. The temporary barriers and the permanent barriers formed in semiconductor substrate 42 intersect in a grid fashion to create wells or pixels for collecting electric charges generated when protons of X-ray radiation energy (R) are incident on photosensitive surface 44. Also positioned on electrode surface 46 is a plurality of collection site electrodes 50*a*, 50*b*, 50*c*, 50*d*, 50*e* and 50*f* which are energized by the first and second phases of the 3-phase clock (not shown) to provide full well capacity and to aid in the collection and transportation of electrical charges (e).

As shown in FIG. 4, semiconductor substrate 42 the plurality of temporary barriers 52–52*d* are created below barrier creating electrodes 48*a*–48*d*, respectively. Temporary barriers 52*a*–52*d* intersect implanted permanent barriers to form wells, or pixels 56*a*, 56*b* and 56*c* for collecting electric charges (e) which are generated when photons of X-ray radiation (R) are incident on photo-sensitive surface 44. Although wells, or pixels 56*a*–56*c* are shown as a linear array for purposes of illustration, preferably, imager 40 is a two-dimensional array having hundreds of rows and hundreds of columns of wells 56, and the number of wells 56 formed in semiconductor substrate 42 is primarily limited by the size of the semiconductor die and the fabrication process used.

As shown in FIG. 4, each of the temporary barriers 52*a*–52*d* have an elongated portion with an end of each elongated portion closest to electrode surface 46 tapering substantially in a U-shape manner. The tapered barriers 52*a*–52*d* significantly reduce the occurrence of split events during integration, when the electric charges (e) resulting from absorbed soft X-ray radiation spread randomly and are divided between two or more wells, 56*a*–56*c*, during integration. Each photo electric charge (e) is a localized phenomena, initially, but in time the electric charges (e) will experience repulsion and diffusion, and spread randomly if the area above the temporary barriers 52*a*–52*d* lacks sufficient potential gradient in the barrier regions closest to electrode surface 46. If the barrier regions are wide adjacent the electrode surface 46, then the substantially horizontal portions of the barriers are essentially gradient free, thus, creating regions of ambiguity in which it cannot be predicted into which well the charge will be collected. By minimizing the widths of the barriers, the gradient free regions are reduced. The widths of temporary barriers 52*a*–52*d* are reduced by making the barrier creating electrodes 48*a*–48*d* as narrow as physically possible. Thus, the barrier creating electrodes are constructed substantially narrower than the charge collection site electrodes to prevent the charge from being divided among adjacent wells during integration.

Preferably, imager 40 is fabricated using MPP technology, and using a triple poly process as disclosed in U.S. Pat. No. 4,302,766, which is incorporated herein by reference, at columns 5–7. Semiconductor substrate 42 includes a p-type material layer 60 and an n-type buried channel 62 diffused into p-type material layer 60. Preferably, p-type material layer 60 comprises p-type silicon, and n-type buried channel 62 comprises n-type silicon. A p-type material (+), such as boron, is implanted in the n-type buried channel 62 using a triple poly process in a region under the location selected for each of the barrier creating electrodes 48*a*–48*d*. The p-type (+) implant reduces the net charge of n-type buried channel 62 in those regions, thereby reducing the channel potential in those regions. During integration, barrier electrodes 48*a*–48*d* and collection site electrodes 50*a*–50*f* are biased at between 0.0 volts and −0.4 volts, while the p-type material layer is biased at approximately 9.0 volts. This results in the full inversion of the silicon surface of the n-type buried channel 62 from n-type to p-type, thereby providing the benefit of suppressing the thermal generation of carriers at the electrode surface 46, which in turn reduces a major contributor of dark current. Still further, the p-type dopant (+) creates a potential difference in substrate 42 under barrier electrodes 52*a*–52*d* and collection site electrodes 50*a*–50*f*, thereby erecting potential barriers 52*a*–52*d* under barrier electrode 48*a*–48*d*, respectfully.

During integration, photons of X-ray radiation are incident on photo-sensitive surface 44 of semiconductor substrate 42 and generate electric charges (e) in relation to the intensity of the X-ray radiation. Due to the potential gradient of temporary barriers 52*a*–52*d*, electric charges (e) created near the apex of the U-shaped region of the barriers are directed toward the closest adjacent well, thus significantly reducing or eliminating the occurrence of split events during integration.

Although the present invention has been described with reference to preferred embodiments, workers skilled in the are will recognize that changes may be made in form and detail without departing from the spirit and scope of the following claims. For example, although the preferred embodiments of the invention are described in conjunction with a three-phase clock, workers skilled in the art will recognize that the invention will also reduce the occurrence of split events in embodiments using other types of multi-phased clocks, such as two or four phase clocks.

I claim:

1. A charge coupled device X-ray imager for generating and collecting electric charges corresponding to received X-ray radiation while reducing the occurrence of split events, comprising:

a semiconductor material having a photosensitive surface for receiving X-ray radiation energy, having an internal region for generating electrical charges corresponding to said received X-ray radiation, and having a plurality of permanent barriers formed therein to divide said semiconductor material into a plurality of columns;

barrier means coupled to said semiconductor material for establishing in said semiconductor material a plurality of temporary barriers having sufficient potential gradient to substantially reduce the occurrence of split events, said barrier means comprising a plurality of barrier electrodes and clock means for applying a voltage to each of said plurality of barrier electrodes, each of said plurality of barrier electrodes being sufficiently narrow so that an application of voltage to each of said barrier electrodes by said clock means establishes a plurality of temporary barriers in said semiconductor material with potential gradients sufficient to substantially reduce the occurrence of split events, and collection means coupled to said semiconductor material having a plurality of collection site electrodes for affecting collection and readout of said generated electrical charges, said plurality of barrier electrodes having a width substantially smaller than the width of each of said plurality of collection site electrodes.

2. The image of claim 1 wherein said plurality of temporary barriers are erected in said plurality of columns to form an array of potential wells.

3. The image of claim 1 wherein each of said plurality of barrier electrodes are positioned adjacent to a portion of said semiconductor material wherein each of said plurality of temporary barriers is to be established.

4. The imager of claim 3 wherein said clock means further comprises a three-phase clock coupled to each of said plurality of barrier electrodes for applying a voltage to each of said plurality of barrier electrodes to establish said temporary barriers.

5. The imager of claim 4 wherein said plurality of collection site electrodes are coupled to said three-phase clock, said three-phase clock energizing said collection site electrodes during an integration period to effect a collection of electrical charges in said array of potential wells.

6. The imager of claim 1 wherein said semiconductor material comprises silicon p-type material.

7. The imager of claim 6 wherein said plurality of permanent barriers are formed by implanting an n-type dopant in said silicon p-type material.

8. The imager of claim 7 wherein said n-type dopant comprises phosphorus.

9. The imager of claim 1 wherein said imager is a multipinned phased CCD.

10. The imager of claim 9 wherein said semiconductor material comprises a layer of silicon p-type material and a layer of silicon n-type material having p-type dopant implanted in said plurality of barrier electrodes.

11. The imager of claim 10 wherein said p-type dopant comprises boron.

12. A method for collecting electrical charges generated by photons of X-ray radiation received by an X-ray imager, comprising the steps of:

providing a semiconductor substrate having a photosensitive surface for receiving X-ray photons, having an electrode surface for receiving a plurality of electrodes, having a region for generating electrical charges corresponding to said photons, and having permanent barriers implanted therein to divide a portion of said semiconductor substrate into a plurality of columns;

providing a plurality of barrier electrodes and a plurality of collection site electrodes mounted to said electrode surface, each of said plurality of barrier electrodes having a width substantially smaller than a width of each of said collection site electrodes;

providing a multi-phase clock having a first phase coupled to said plurality of barrier electrodes;

energizing said plurality of barrier electrodes to erect a corresponding plurality of temporary barriers, each of said plurality of temporary barriers having sufficient potential gradient to reduce the occurrence of split events, said plurality of temporary barriers being positioned in said plurality of columns to create an array of potential wells;

providing from said multi-phase clock at least a second phase coupled to said plurality of collection site electrodes; and energizing said plurality of collection site electrodes during an integration period to effect a collection of electrical charges in said array of potential wells.

13. A charge coupled device imager for receiving X-ray photons from an object, comprising:

a semiconductor substrate having a photosensitive surface for receiving X-ray photons, having an electrode surface for receiving a plurality of electrodes, having a region for generating electrical charges corresponding to said photons, and having permanent barriers implanted therein to divide a portion of said semiconductor substrate into a plurality of columns;

a plurality of barrier electrodes and a plurality of collection site electrodes mounted to said electrode surface, each of said plurality of barrier electrodes having a width substantially smaller than a width of each of said collection site electrodes;

a multi-phase clock having a first phase coupled to said barrier electrodes for energizing said plurality of barrier electrodes to erect a corresponding plurality of temporary barriers, each of said plurality of temporary barriers having sufficient potential gradient to reduce the occurrence of split events, said temporary barriers being positioned in said plurality of columns to create an array of potential wells;

said multi-phase clock having at least a second phase coupled to said plurality of collection site electrodes for energizing said plurality of collection site electrodes during an integration period to effect a collection of electrical charges in said array of potential wells.

14. The imager of claim 13 wherein said semiconductor substrate comprises silicon p-type material.

15. The imager of claim 14 wherein said permanent barriers are formed by implanting an n-type dopant in said silicon p-type material.

16. The imager of claim 15 wherein said n-type dopant comprises phosphorus.

17. The imager of claim 13 wherein said imager is a multipinned phased CCD.

18. The imager of claim 17 wherein said semiconductor substrate comprises a silicon p-type material layer and a silicon n-type material layer, and having p-type dopant implanted in said silicon n-type material in a region under each of said plurality of barrier electrodes.

19. The imager of claim 18 wherein said p-type dopant comprises boron.

* * * * *